(12) United States Patent
Katakura et al.

(10) Patent No.: US 7,800,103 B2
(45) Date of Patent: Sep. 21, 2010

(54) ORGANIC THIN FILM TRANSISTOR MATERIAL, ORGANIC THIN FILM TRANSISTOR, FIELD-EFFECT TRANSISTOR, SWITCHING ELEMENT, ORGANIC SEMICONDUCTOR MATERIAL AND ORGANIC SEMICONDUCTOR FILM

(75) Inventors: Rie Katakura, Hino (JP); Hiroshi Kita, Hachioji (JP); Katsura Hirai, Hachioji (JP); Tatsuo Tanaka, Sagamihara (JP)

(73) Assignee: Konica Minolta Holdings, Inc., Tokyo (JP)

( * ) Notice: Subject to any disclaimer, the term of this patent is extended or adjusted under 35 U.S.C. 154(b) by 349 days.

(21) Appl. No.: 11/720,367

(22) PCT Filed: Nov. 17, 2005

(86) PCT No.: PCT/JP2005/021082
§ 371 (c)(1),
(2), (4) Date: May 29, 2007

(87) PCT Pub. No.: WO2006/059486
PCT Pub. Date: Jun. 8, 2006

(65) Prior Publication Data
US 2008/0121873 A1    May 29, 2008

(30) Foreign Application Priority Data
Dec. 2, 2004 (JP) .............................. 2004-349539
Aug. 26, 2005 (JP) .............................. 2005-245730

(51) Int. Cl.
*H01L 51/30* (2006.01)

(52) U.S. Cl. ................... 257/40; 257/E51.028; 438/82

(58) Field of Classification Search ................ 257/40, 257/740, 690; 438/690, 82, 99
See application file for complete search history.

(56) References Cited

U.S. PATENT DOCUMENTS

| | | | | |
|---|---|---|---|---|
| 6,638,644 B2 * | 10/2003 | Zheng et al. | ................ | 428/690 |
| 6,686,065 B2 * | 2/2004 | Chen | .......................... | 428/690 |
| 7,285,341 B2 * | 10/2007 | Zheng et al. | ................ | 428/690 |
| 7,348,071 B2 * | 3/2008 | Zheng et al. | ................ | 428/690 |
| 2006/0273311 A1 * | 12/2006 | Ohe et al. | ..................... | 257/40 |

FOREIGN PATENT DOCUMENTS

| | | |
|---|---|---|
| JP | 2003155289 | 5/2003 |
| JP | 2004179249 | 6/2004 |

* cited by examiner

*Primary Examiner*—Roy K Potter
(74) *Attorney, Agent, or Firm*—Lucas & Mercanti, LLP

(57) ABSTRACT

An objective is to provide an organic thin film transistor material exhibiting an excellent property as a transistor together with reduced aging degradation, and also to provide an organic thin film transistor, a field-effect transistor, a switching element, an organic semiconductor material and an organic semiconductor film employing the organic thin film transistor material. Disclosed is an organic thin film transistor material possessing a compound represented by the following Formula (1).

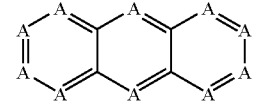

Formula (1)

where A composed of a condensed ring formed with a 6 membered aromatic cycle or a 6 membered aromatic heterocycle represents C—R, N or P; at least one of As is N or P; R represents a hydrogen atom, a halogen atom or a substituent; and R may be bonded with other Rs with each other to form a ring.

15 Claims, 1 Drawing Sheet

ORGANIC THIN FILM TRANSISTOR MATERIAL, ORGANIC THIN FILM TRANSISTOR, FIELD-EFFECT TRANSISTOR, SWITCHING ELEMENT, ORGANIC SEMICONDUCTOR MATERIAL AND ORGANIC SEMICONDUCTOR FILM

TECHNICAL FIELD

The present invention relates to an organic thin film transistor material, an organic thin film transistor, a field-effect transistor, a switching element, an organic semiconductor material and an organic semiconductor film.

BACKGROUND

Need of flat panel display for computer rises accompanied with spreading of information terminals. Moreover, electronic paper or digital paper as a thin, light and easily mobile displaying medium is needed because the chance of providing information in a form of electronic signals instead of paper medium is increased accompanied with the progress of information system.

In the planar displaying apparatus, the displaying medium is generally constituted by the use of an element applying liquid crystal, organic EL or electrophoresis. In such the displaying medium, technology in which an active driving element (TFT element) is principally applied for obtaining a uniformity of the brightness and a high rewrite speed of the image. In usual displays for computer, for example, the TFT elements are formed on a glass substrate and the liquid crystals or the organic EL elements are sealed.

A semiconductor such as a-Si (amorphous silicon) and p-Si (polysilicon) is employable for the TFT element. The TFT element is formed by successively laminating the silicon semiconductor and a metal layer according to necessity for forming a source electrode, a drain electrode and a gate electrode. A production process utilizing vacuum such as a spattering process is usually needed for producing the TFT element.

In the production of the TFT element, the production process including a vacuum process using a vacuum chamber has to be repeatedly applied for forming the constituting layers. Consequently, the costs for equipment and running the production become very high. For the TFT element, processes such as a vacuum deposition, doping and photolithography should be repeatedly performed for each of the layers. Therefore, the element is formed on the substrate through several tens processes. In a semiconductor portion making the important point of switching action, plural kinds of layer such as a p-type semiconductor layer and an n-type semiconductor layer are laminated. In such the processes for producing the silicon semiconductor, the change of the equipment corresponding to the requirement of large-sizing of the displaying image is difficult because largely changing in the design of the production apparatus such as the vacuum chamber is necessary.

The substrate material is desired to be a material capable of withstanding a process temperature since the conventional production processes for TFT elements employing silicon include a high temperature process.

Consequently, glass is only practically usable. Therefore, the displaying apparatus becomes one which is heavy, lacking in the flexibility and easily broken by falling when the displaying apparatus is constituted by the usual TFT elements. Such the properties caused by forming the TFT elements on the glass substrate are not suitable for satisfying the requirements for the light mobile thin display accompanied with the progress of the information system.

Besides, in recent years, studies on organic semiconductor material having high charge transport ability have intensively been done. Such the compounds are expected as an element of an organic laser oscillation element (Non-patent Document 1, for example) additionally to the charge transport material of the organic EL element, and that of organic thin film transistor such as those reported in various reports (Non-patent Document 2, for example).

Though it may impossible to produce the semiconductor element by such the low temperature process by using the usual silicon type semiconductor material, it may be possible with respect to the device employing the organic semiconductor. Therefore, the limitation of the substrate heat resistance is alleviated and, for example, the TFT element may be possible to be formed on a transparent resin substrate plate. When the TET elements can be formed on the transparent resin substrate plate and the displaying materials can be driven by the TFT elements, the display may be produced as one lighter in weight, and higher in flexibility than those of conventional ones, and be hardly or difficulty broken by falling.

However, the organic semiconductors studied for realizing such the TFT element are only limited kinds of compound, for example, an acene-type compound such as pentacene and anthracene (Patent Document 1, for example), a phthalocyanine including lead phthalocyanine, a low molecular weight compound such as perylene and its tetracarboxylic acid derivative (Patent Document 2, for example), an aromatic oligomer typically such as a hexamer of thiophene so-called as α-thienyl or sexithiophnen (Patent Document 3, for example), a compound of naphthalene or anthracene symmetrically condensed with a 5-member aromatic heterocycle (Patent Document 4, for example), a mono-, oligo- and poly-thienylenopyridine (Patent Document 5, for example) and a conjugate polymer such as polythiophene, poly(thienylene vinylene) and poly(p-phenylene vinylene) (Non-patent Documents 1-3, for example). Thus, the development of a semiconducting composition material employing a new charge transport material exhibiting high carrier mobility has been demanded.

Cost reduction is expected in view of productivity when a pentacene derivative-containing layer about which excellent properties as a commonly known organic semiconductor material are reported can not be formed via a vacuum evaporation process, but be formed via solution coating such as an ink-jet method and so forth. However, There is a manufacturing problem pointed out, such that stability of the coating solution is insufficient to the fact that the pentacene derivative had insufficient solubility to various organic solvents, and crystallization or precipitation also tends to be generated after preparing a solution. Thus, disclosed is a technique concerning an organic TFT material with the pentacene derivative into which substituents were introduced (refer to Patent Documents 9 and 10, for example) in order to improve solubility as well as stability of the coating solution, but there is a problem such that it is difficult to obtain sufficient solubility by introducing an alkyl group and the like, to maintain operability in temperature control during coating, and to prepare an evenly coated layer.

Japanese Patent O.P.I. Publication No. 2003-292588, U.S. Patent Opened Application Nos. 2003/13658, 2003/160230 and 2003/164495 describe as follows. "The mechanical strength of a logical integrated circuit element for microelectronics is largely improved and the using life time of it can be prolonged by employing a polymer TFT. However, the polythiophene semiconductors are mostly instable in air because which is doped by oxygen in the atmosphere so that the electro conductance of it is increased. As a result of that, the off current of the device produced from such the materials is increased, and the on/off ratio of the electric current is decreased. Japanese Patent O.P.I. Publication No. 2003-292588, U.S. Patent Opened Application Nos. 2003/13658, 2003/160230 and 2003/164495 describe as follows. "The mechanical strength of a logical integrated circuit element for microelectronics is largely improved and the using life time of it can be prolonged by employing a polymer TFT. However, the polythiophene semiconductors are mostly instable in air because which is doped by oxygen in the atmosphere so that the electro conductance of it is increased. As a result of that, the off current of the device produced from such the materials is increased, and the on/off ratio of the electric current is decreased. Therefore, the materials should be strictly controlled in such a way that oxygen in the atmosphere is eliminated during material processing and device production so as to prevent or minimize the oxidation doping. An advantage of TFT, in which a polymer semiconductor is utilized in a cost-effective technology in place of an amorphous silicon technology for a large-area device, is degraded since the precautionary measure raises the production cost. However, those together with other drawbacks are avoided or minimized in the embodiments of the present invention. Accordingly, it is described in Patent Documents 6-8 that an electronic device exhibiting a high resistance against oxygen as well as a relatively high ON/OFF ratio of the electric current is demanded, and the various means for solving the problems are disclosed. However, further improvement is still desired since no improvement level is sufficiently satisfied.

Patent Document 1: Japanese Patent O.P.I. Publication No. 5-55568

Patent Document 2: Japanese Patent O.P.I. Publication No. 5-190877

Patent Document 3: Japanese Patent O.P.I. Publication No. 8-264805

Patent Document 4: Japanese Patent O.P.I. Publication No. 11-195790

Patent Document 5: Japanese Patent O.P.I. Publication No. 2003-155289

Patent Document 6: Japanese Patent O.P.I. Publication No. 2003-261655

Patent Document 7: Japanese Patent O.P.I. Publication No. 2003-264327

Patent Document 8: Japanese Patent O.P.I. Publication No. 2003-268083

Patent Document 9: WO No. 03/016599

Patent Document 10: U.S. Patent Opened Application Nos. 2003/0105365

Non-patent Document 1: "Science" vol. 289, p. 599, (2000)

Non-patent Document 2: "Nature" vol. 403, p. 521, (2000)

Non-patent Document 3: "Advanced Material" 2002, No. 2, p. 99, (2002)

DISCLOSURE OF THE INVENTION

Problems to be Solved by the Invention

The present invention was made on the basis of the above-described situation. It is an object of the present invention to provide an organic thin film transistor material exhibiting an excellent property as a transistor together with reduced aging degradation, and also to provide an organic thin film transistor, a field-effect transistor, a switching element, an organic semiconductor material and an organic semiconductor film employing the organic thin film transistor material.

Means to Solve the Problems

The above-described object of the present invention is accomplished by the following structures.

(Structure 1) An organic thin film transistor material comprising a polycondensed heteroaromatic compound represented by the following Formula (1).

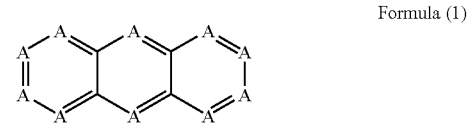

Formula (1)

where each A independently represents a nonmetal atom, provided that at least one of plural As is an atom other than a carbon atom, or at least two of nonmetal atoms represented by A are carbon atoms and when each of the carbon atoms comprises a substituent, substituents may be bonded with each other to form a ring.

(Structure 2) The organic thin film transistor material of Structure 1, wherein the polycondensed heteroaromatic compound of Formula (1) is a compound represented by the following Formula (2), (3) or (4).

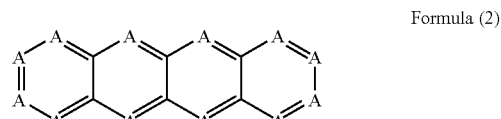

Formula (2)

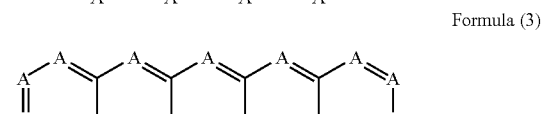

Formula (3)

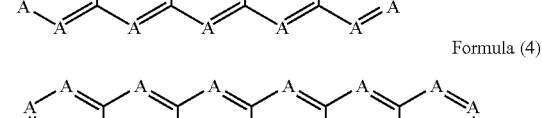

Formula (4)

where each A in Formulae (2), (3) and (4) independently represents a nonmetal atom, provided that at least one of plural As is an atom other than a carbon atom.

(Structure 3) The organic thin film transistor material of Structure 1 or 2, wherein A is N, P or C—R, where R is a hydrogen atom, a halogen atom or a substituent, and R may be bonded with other Rs with each other to form a ring.

(Structure 4) The organic thin film transistor material of any one of Structures 1-3, wherein A is N or C—R, where R is a hydrogen atom, a halogen atom or a substituent, and R may be bonded with other Rs with each other to form a ring.

(Structure 5) The organic thin film transistor material of any one of Structures 1-4, wherein at least one of (C—R)s represented by A is C—C≡C—$R_1$, where $R_1$ represents a substituent.

(Structure 6) The organic thin film transistor material of Structure 1, wherein the polycondensed heteroaromatic compound represented by Formula (1) is a compound represented by the following Formula (5).

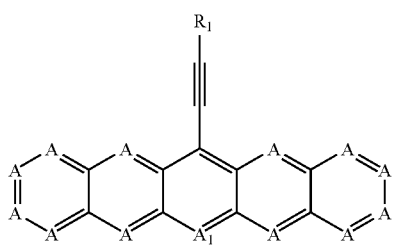

Formula (5)

where A in Formula (5) is synonymous with A in Formula (1), and R₁ represents a substituent.

(Structure 7) The organic thin film transistor material of Structure 6, wherein A and A₁ are N or C—R, where R is a hydrogen atom, a halogen atom or a substituent, and R may be bonded with other Rs with each other to form a ring.

(Structure 8) The organic thin film transistor material of Structure 6 or 7, wherein A₁ is C—C≡C—R₁, where R₁ is synonymous with A in Formula (5).

(Structure 9) An organic thin film transistor comprising a semiconductor layer formed from the organic thin film transistor material of any one of Structures 1-8.

(Structure 10) A field-effect transistor comprising an organic charge transport material and a gate electrode connected directly or indirectly to the organic charge transport material, wherein an electric current in the organic charge transport material is controlled via application of an electric potential between the gate electrode and the organic charge transport material, and wherein the organic charge transport material is the organic thin film transistor material of any one of Structures 1-8.

(Structure 11) A switching element comprising the organic thin film transistor of Structure 9 or the field-effect transistor of Structure 10.

(Structure 12) An organic semiconductor material comprising a compound represented by any one of Formulae (1)-(5).

(Structure 13) An organic semiconductor film comprising the organic semiconductor material of Structure 12.

(Structure 14) An organic semiconductor film formed via the steps of (a) dissolving or dispersing the organic semiconductor material of Structure 12 in an organic solvent; and (b) conducting a drying process after coating a solution or dispersant obtained in step (a).

EFFECT OF THE INVENTION

The present invention can provide an organic thin film transistor material exhibiting an excellent property as a transistor together with reduced aging degradation, and also to provide an organic thin film transistor, a field-effect transistor, a switching element, an organic semiconductor material and an organic semiconductor film employing the organic thin film transistor material.

BRIEF DESCRIPTION OF THE DRAWINGS

FIG. 1(a) - FIG. 1(f) shows an example of the constitution of an organic TFT of the present invention.

FIG. 1(a) shows a field-effect transistor in which source electrode 2 and drain electrode 3 are formed on support 6 and organic semiconductor layer 1 of the organic thin film transistor material according to the present invention is provided between electrodes, and insulating layer 5 is formed thereon, and gate electrode 4 is formed on insulating layer 5 to form the field-effect transistor.

FIG. 1(b) shows one in which organic semiconductor layer 1 is formed by a coating method so that the layer covers the entire surface of the electrode and the substrate; such that the layer is formed between two electrodes in FIG. 1(a).

FIG. 1(c) shows that organic semiconductor layer 1 is firstly formed by coating onto substrate 6 and then source electrode 2, drain electrode 3, insulating layer 5 and gate electrode 4 are provided.

FIG. 1(e) shows an example of another structure.
FIG. 1(f) shows an example of another structure.

EXPLANATION OF NUMERALS

Figure 1:
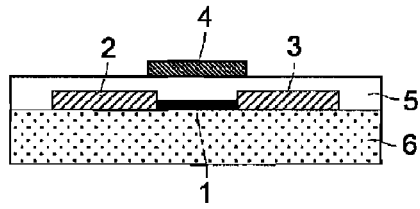
FIG. 1 (d) shows that gate electrode 4 of metal foil is formed on support 6 that then insulating layer 5 is formed thereon, source electrode 2 and drain electrode 3 each formed by the metal foil on the insulating layer, and then semiconductor layer 1 is formed between the electrodes by the organic thin film transistor material of the present invention.
Figure 1:
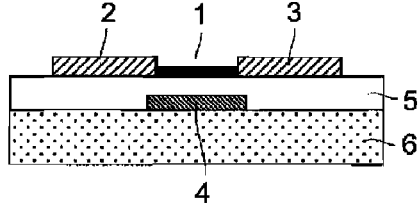
Figure 1:
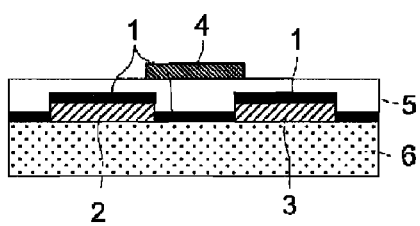
Figure 1:
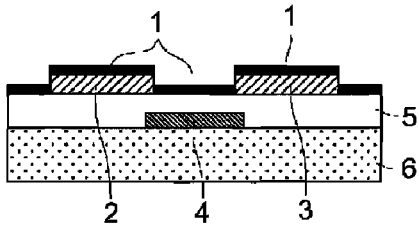
Figure 1:
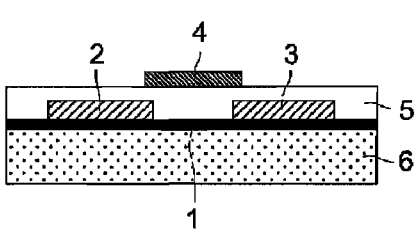
Figure 1:
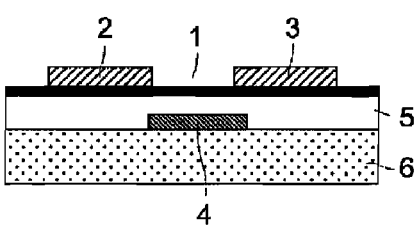

1 Organic semiconductor layer
2 Source electrode
3 Drain electrode
4 Gate electrode
5 Gate insulating layer
6 Substrate
7 Gate busline
8 Source busline
10 Organic TFT sheet
11 Organic TFT
12 Output element
13 Storage capacitor
14 Vertical drive circuit
15 Horizontal drive circuit

DESCRIPTION OF THE PREFERRED EMBODIMENTS

As for an organic thin film transistor (TFT) material of the present invention, an organic thin film transistor material useful for the application of a thin film transistor can be obtained by utilizing the present invention according to any one of structures 1-5. It was found out that an organic thin film transistor of the present invention prepared with the organic TFT material and a field-effect transistor of the present invention exhibited excellent transistor characteristics such as high carrier mobility and an excellent ON/OFF ratio property (a ratio of the maximum current value to the minimum current value in a gate voltage variation), together with high durability. It was also found out that a switching element prepared with the organic thin film transistor or the field-effect transistor exhibited excellent switching characteristics.

Pentacene is well known as an organic TFT material, but film formation has been available only via vacuum evaporation so far, and it is difficult to prepare coated layers, since pentacene is insoluble. In order to improve solubility of pentacene, appropriate substituents are introduced as described in WO No. 03/016599, but it is very difficult in view of the synthesis.

On the one hand, a coatable material such as a thiophene polymer typified by PHT (polyhexylthiophene) is provided, but when a coated layer is formed, π-stacking formation is partial in the case of a polymer having a molecular weight distribution, and molecules tend to be disarranged, whereby insufficient TFT performance is obtained.

On the other hand, a compound of the present invention containing a heteroatom is capable of forming π-stacking to exhibit attractive TFT performance. Further, solubility is improved by introducing various substituents since the substituents are easy to be introduced in view of the synthesis, whereby coating can be carried out via dissolution with an appropriate solvent.

Further, when a compound of the present invention contains an electron-withdrawing group of —N═ in an aromatic cycle, charge polarization is slightly generated in the same molecule. It was found out that this positive and negative charge polarization produced a weak electrostatic attraction between molecules when molecules were arranged, resulting in producing a stimulating effect on molecule-to-molecule packing. It is assumed that such the compound of the present invention becomes capable of forming a layer having high crystallization, so that the coated layer not only exhibits high mobility, but also becomes a thin film into which oxygen, water or such as a degradation factor is difficult to penetrate, whereby durability can be improved.

Furthermore, a compound of the present invention possesses oxidation stability since molecules exhibit an electron-withdrawing property, and oxidation resistance is also improved by introducing an electron-withdrawing ethynyl group. Introduction into an aromatic cycle constituting a polycondensed aromatic heterocycle is effective, but specifically, introduction into a ring other than an electronically active bi-terminal type aromatic ring has produced higher effects. Thus, it became possible to provide a material exhibiting high oxidation stability, together with high mobility.

<<Organic Thin Film Transistor Material>>

The organic thin film transistor material of the present invention will be described.

The foregoing Formulae (1), (2), (3), (4) and (5) include those linked with a divalent spacer group or a mere bonding hand, possessing Formulae (1), (2), (3) and (4) as a partial structure such as compounds 55, 74, 77, 78, 79 and 81. That is, as to Formulae (1), (2), (3) and (4), when A is represented by CR in the foregoing Formulae (1), (2), (3), (4) and (5), a substituent represented by R of CR part may be taken into account.

In foregoing Formulae (1), (2), (3), (4) and (5), A representing C—R, N (nitrogen) or P (phosphorus) is composed of a condensed ring formed with a 6 membered aromatic cycle or a 6 membered aromatic heterocycle, and at least one of As is N or P. $A_1$ also represents C—R, N or P, and R is synonymous with R in foregoing formula (1). Examples of substituents represented by R include, alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group and penta decyl), cycloalkyl groups (for example, a cyclopentyl group and a cyclohexyl group), alkenyl groups (for example, a vinyl group, and an allyl group, alkynyl groups (for example, an ethynyl group, a propergyl group), an aryl group (for example, a phenyl group and a naphthyl group), a heteroaromatic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group and a pfthalazinyl group), heterocyclic groups (for example, a pyrrolidyl group, an imidazolysyl group, a morpholyl group and a oxazolidyl group), alkoxyl groups (for example, a methoxy group, an ethoxy group, a propyloxy group, a pentyloxy group, a hexyloxy group, an octyloxy group and a dodecyloxy group), cycloalkoxyl groups (for example, a cyclopentyloxy group, a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group and a dodecyl thio group), cyclo alkylthio groups (for example, a cyclopentylthio group and a cyclohexylthio group, arylthio groups (for example, a phenylthio group and a naphthylthio group), alkoxy carbonyl groups (for example, a methyl oxycarbonyl group, an ethyl oxycarbonyl group, a butyl oxycarbonyl group, an octyl oxycarbonyl group and a dodecyl oxycarbonyl group), an aryl oxycarbonyl groups (for example, a phenyl oxycarbonyl group and a naphthyl oxycarbonyl group), sulfamoyl groups (for example, an amino sulfonyl group, a methyl amino sulfonyl group, a dimethyl amino sulfonyl group, a butyl amino sulfonyl group, a hexyl amino sulfonyl group, a cyclohexyl amino sulfonyl group, an octyl amino sulfonyl group, a dodecyl amino sulfonyl group, a phenyl amino sulfonyl group, a naphthyl amino sulfonyl group and a 2-pyridyl amino sulfonyl group), acyl groups (for example, an acetyl group, an ethyl carbonyl group, a propyl carbonyl group, a pentyl carbonyl group, a cyclohexyl carbonyl group, an octyl carbonyl group, 2-ethyl hexyl carbonyl group, a dodecyl carbonyl group, a phenyl carbonyl group, a naphthyl carbonyl group and a pyridyl carbonyl group), acyloxy groups (for example, an acetyl oxy group, an ethyl carbonyl oxy group, a butyl carbonyl oxy group, an octyl carbonyl oxygroup, a dodecyl carbonyl oxygroup and a phenyl carbonyl oxygroup), amide groups (for example, a methyl carbonyl amino group, an ethyl carbonyl amino group, a dimethyl carbonyl amino group, a propyl carbonyl amino group, a pentyl carbonyl amino group, a cyclohexyl carbonyl amino group, a 2-ethyl hexyl carbonyl amino group, an octyl carbonyl amino group, a dodecyl carbonyl amino group, a phenyl carbonyl amino group and a naphthyl carbonyl amino group), carbamoyl groups (for example, an amino carbonyl group, a methyl amino carbonyl group, a dimethylamino carbonyl group, a propyl amino carbonyl group, a pentyl amino carbonyl group, a cyclohexyl amino carbonyl group, an octyl amino carbonyl group, a 2-ethyl hexyl amino carbonyl group, a dodecyl amino carbonyl group, a phenylamino carbonyl group, a naphthyl amino carbonyl group and a 2-pyridyl amino carbonyl group), ureide groups (for example, a methyl ureide group, an ethyl ureide group, a pentyl ureide group, a cyclohexyl ureide group, an octyl ureide group, a dodecyl ureide group, a phenyl ureide group, a naphthyl ureide group and a 2-pyridyl amino ureide group), sulfinyl groups (for example, a methyl sulfinyl group, an ethyl sulfinyl group, a butyl sulfinyl group, a cyclohexyl sulfinyl group, a 2-ethyl hexyl sulfinyl group, a dodecyl sulfinyl group, a phenyl sulfinyl group, a naphthyl sulfinyl group and a 2-pyridyl sulfinyl group), alkyl sulfonyl groups (for example, a methyl sulfonyl group, an ethyl sulfonyl group, a butyl sulfonyl group, a cyclohexyl sulfonyl group, a 2-ethyl hexyl sulfonyl group and a dodecyl sulfonyl group) aryl sulfonyl groups (for example, a phenyl sulfonyl group, a naphthyl sulfonyl group and a 2-pyridyl sulfonyl group), amino groups (for example, an amino group, an ethyl amino group, a dimethyl amino group, a butyl amino group, a cyclopentyl amino group, a 2-ethyl hexyl amino group, a dodecyl amino group, an anilino group, a naphthyl amino group and a 2-pyridyl amino group), halogen atoms (for example, a fluorine atom, a chlorine atom and a bromine atom), fluorocarbon groups (for example, a fluoro methyl group, a trifluoro methyl group, a pentafluoro ethyl group and a pentafluorophenyl group), a cyano group, a nitro group, a hydroxy group, a mercapto group, silyl groups (for example, a trimethyl silyl group, a triisopropyl silyl group, a triphenyl silyl group and a phenyl diethyl silyl group).

R may also be bonded with another R with each other to form a 6 membered ring, and substitution may be performed to the 6 membered ring with the substituents as described above.

As for substituents represented by $R_1$, those represented by the foregoing R are provided as examples.

Specific examples of compounds represented by foregoing Formula (1) in the present invention are shown below, but the present invention is not limited thereto.

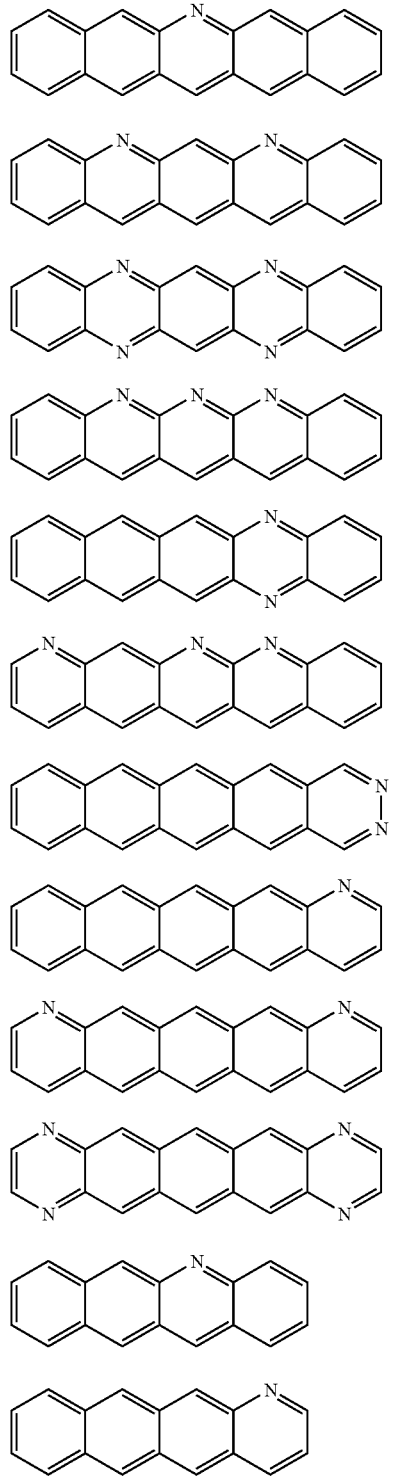
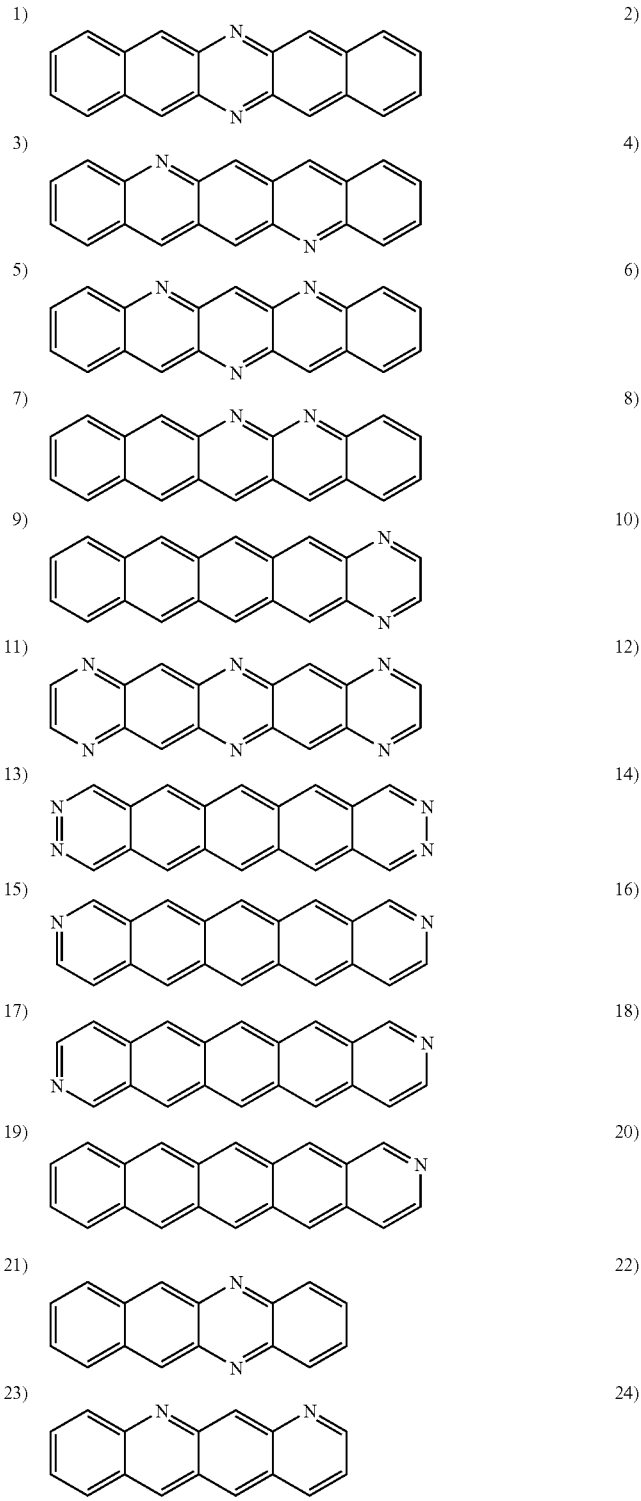

-continued
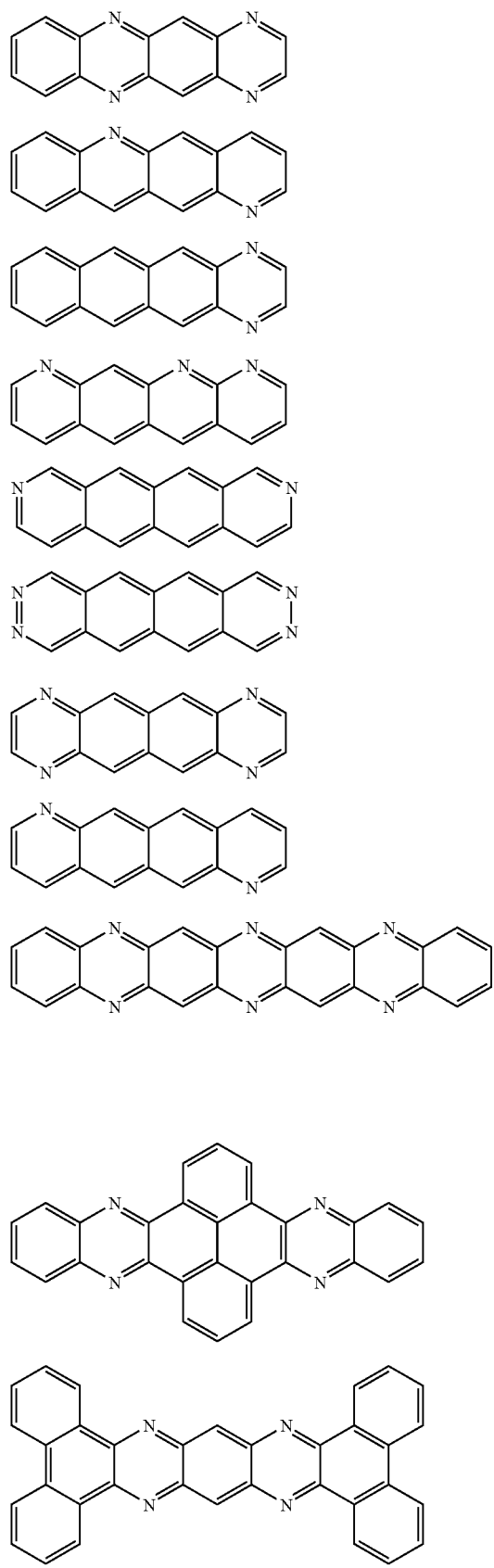
25) 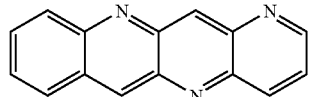
26) 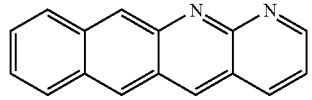
27) 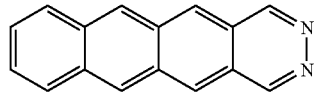
28) 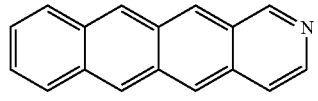
29) 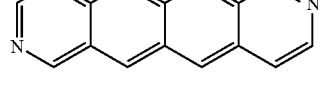
30) 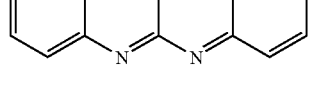
31) 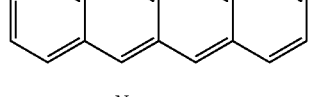
32) 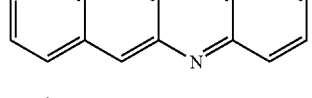
33) 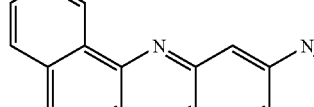
34) 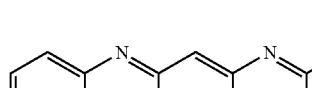
35) 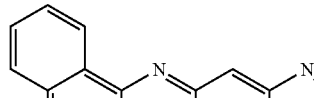
36) 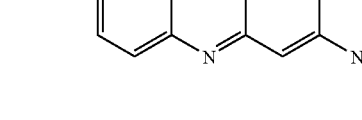

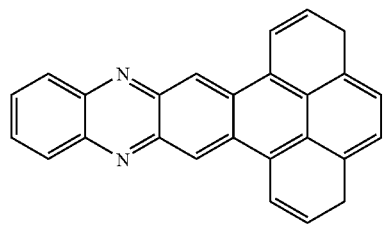
47)
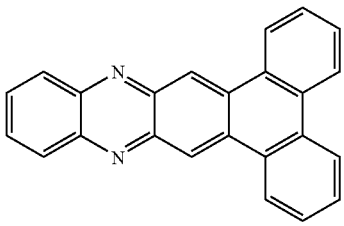
48)
49)
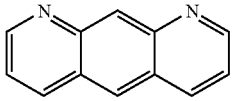
50)
51)
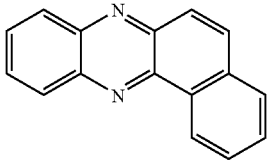
52)
53)
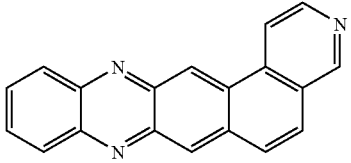
54)
55)
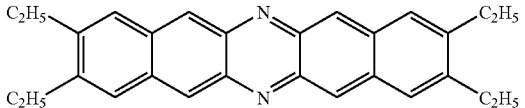
56)
57)
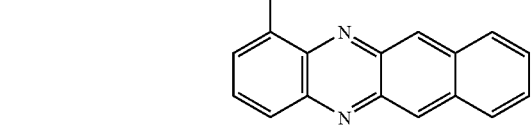
58)
59)
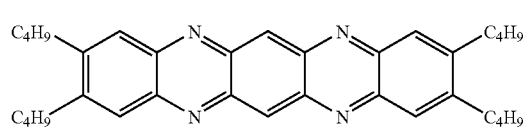
60)
61)
62)
63)
64)

-continued
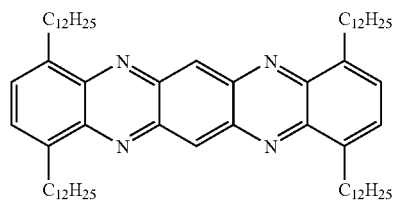
65)
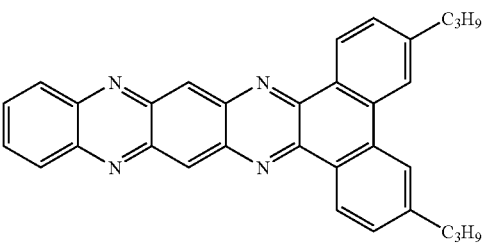
66)
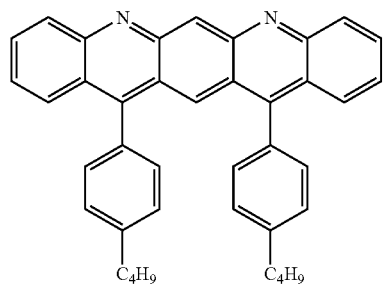
67)
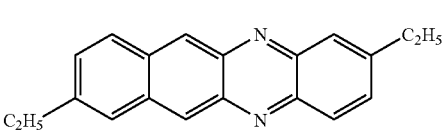
68)
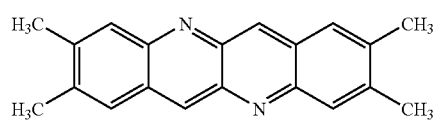
69)
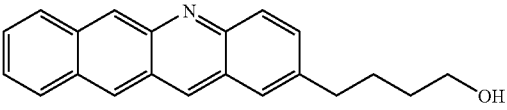
70)
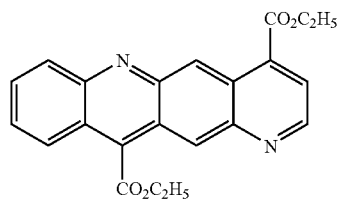
71)
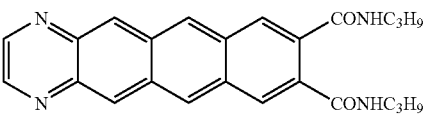
72)
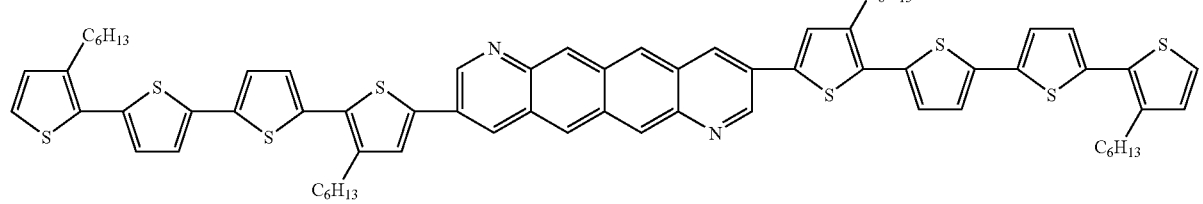
73)
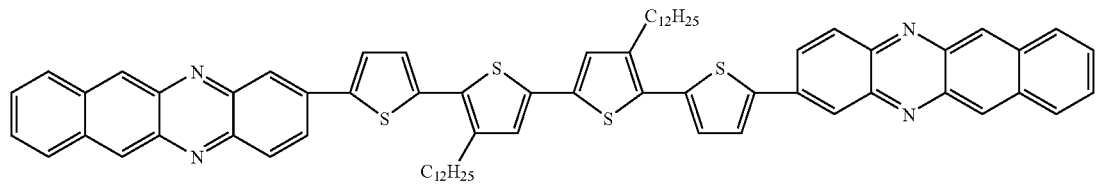
74)
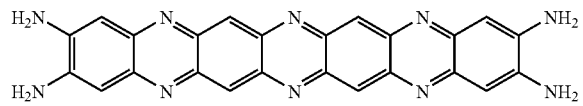
75)
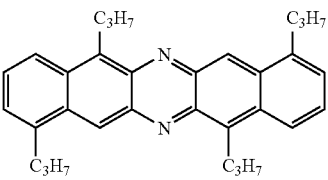
76)

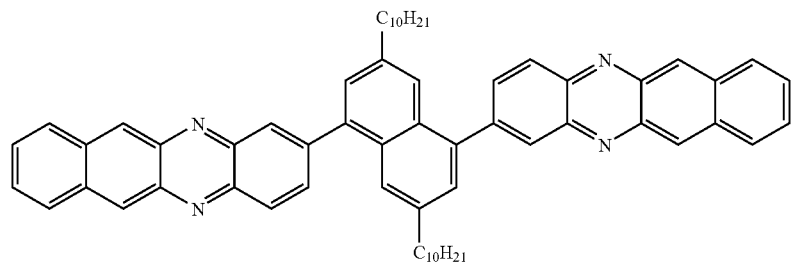
77)
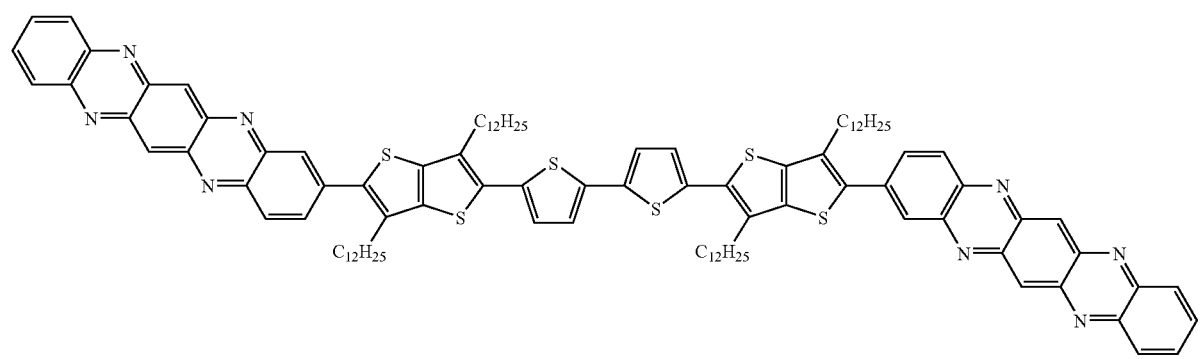
78)
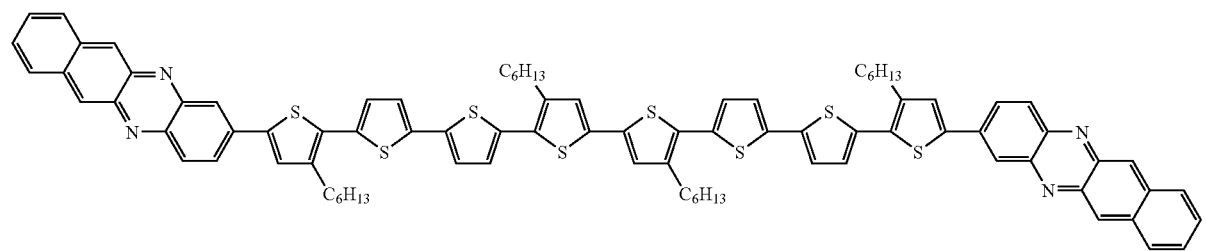
79)
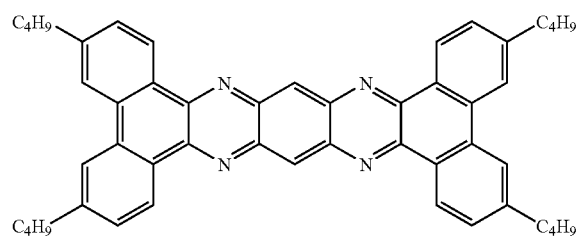
80)
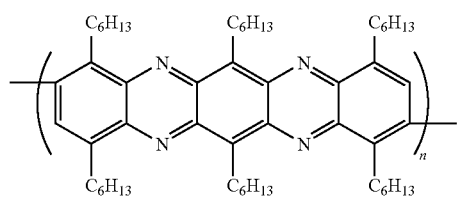
81)

-continued
82)
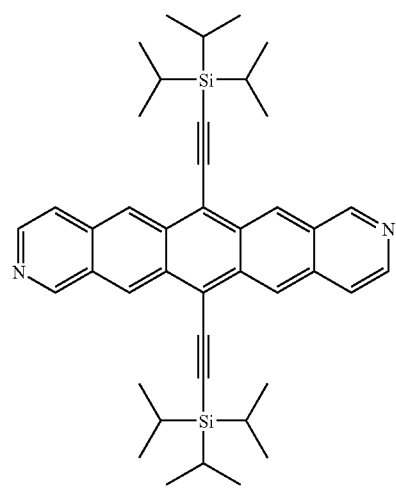
83)
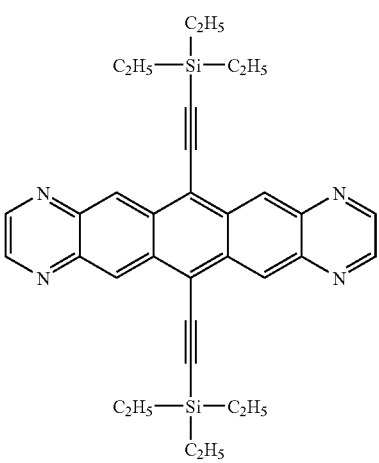
84)
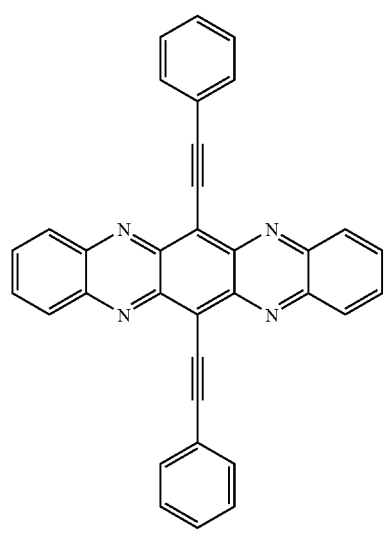
85)
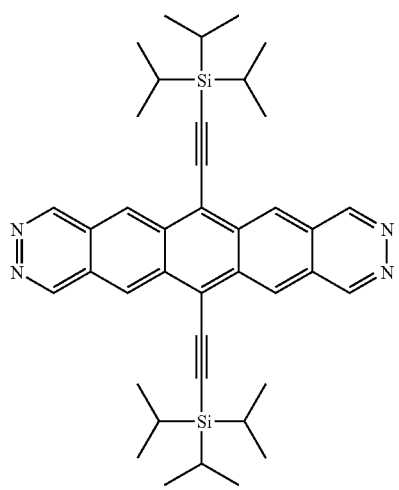
86)
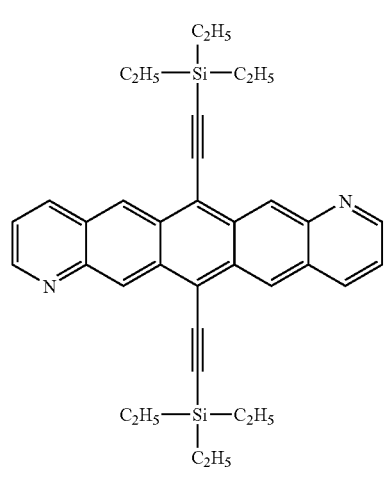
87)
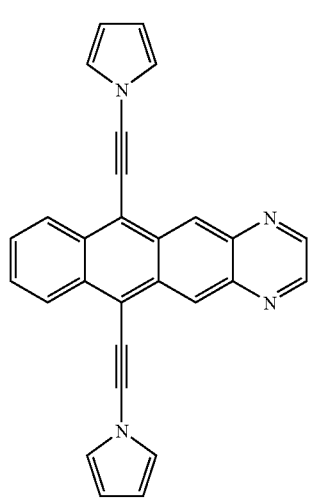

-continued
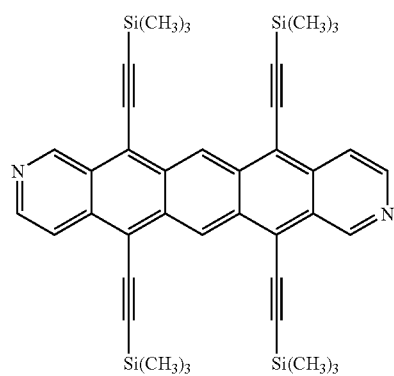
88)
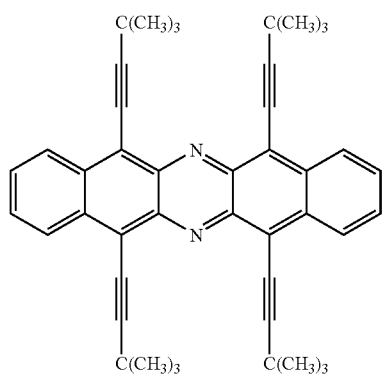
89)
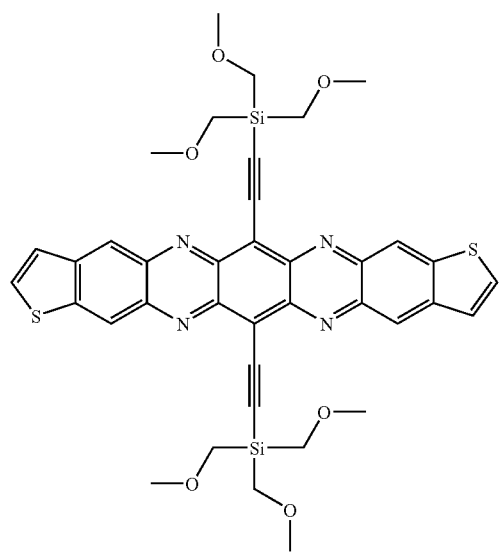
90)
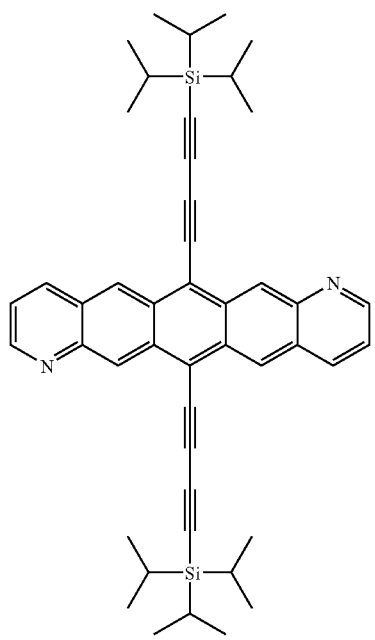
91)
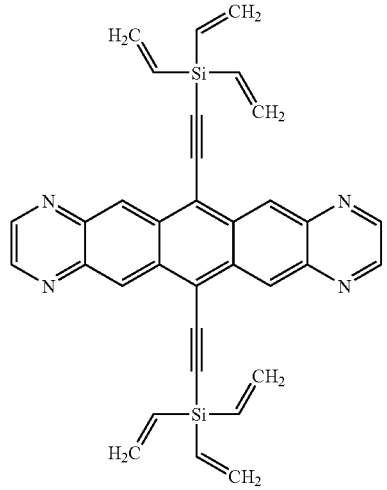
92)
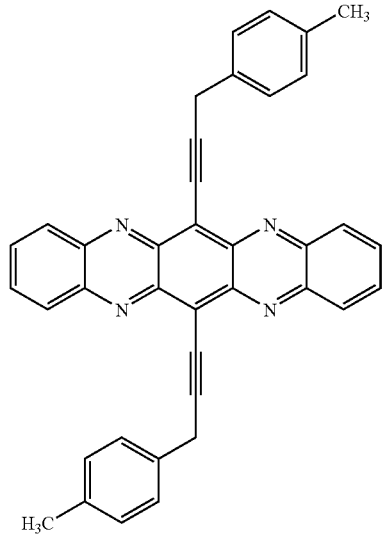
93)

23
94)
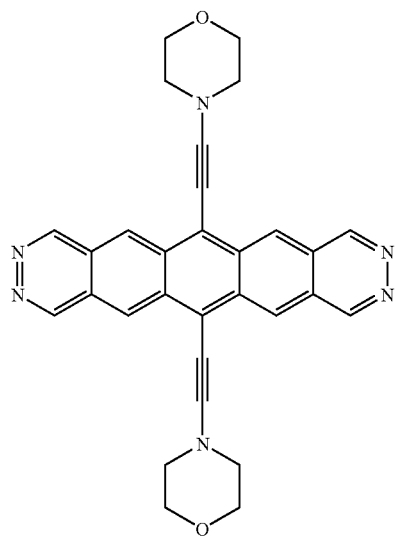
-continued
95)
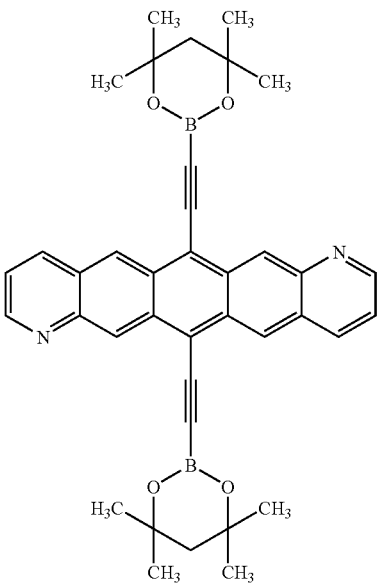
96)
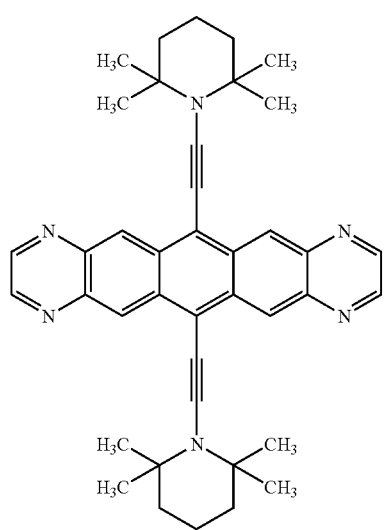
97)
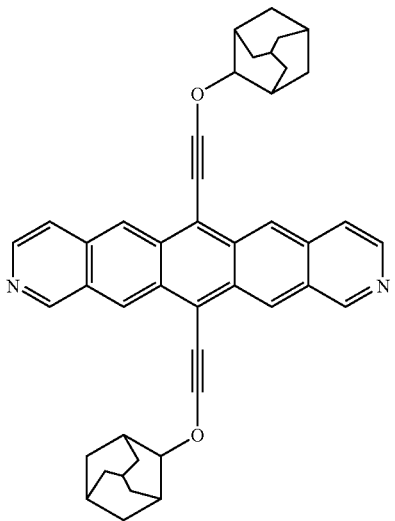

-continued
98)
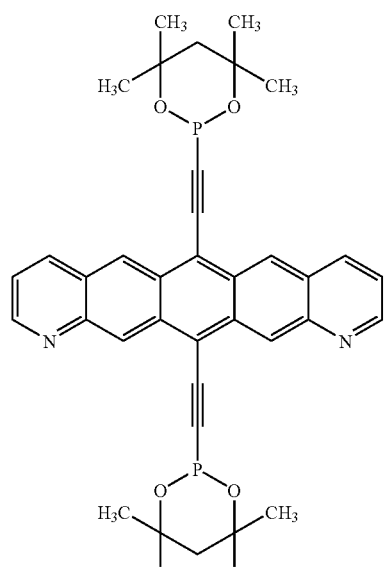
99)
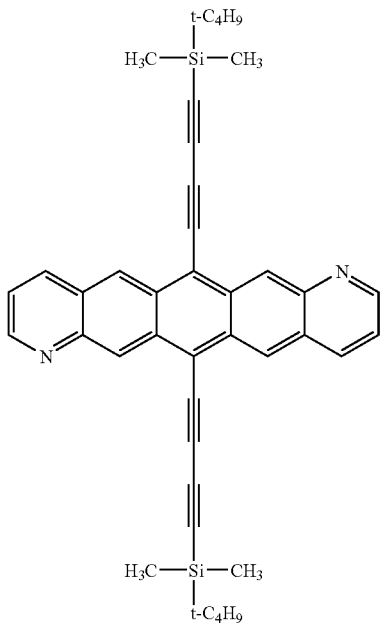
100)
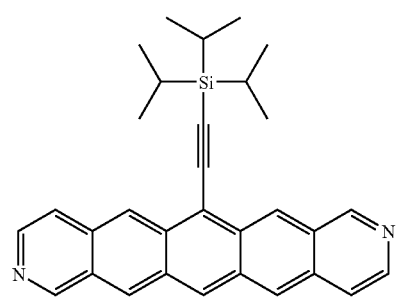
101)
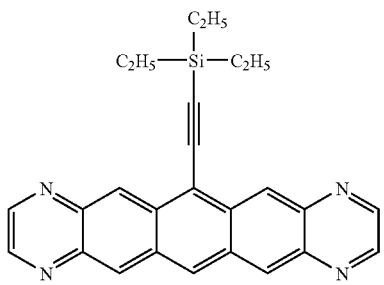
102)
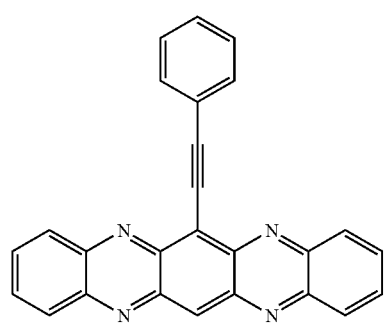
103)
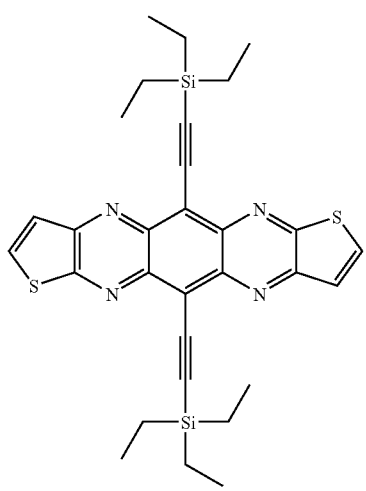

-continued
104)
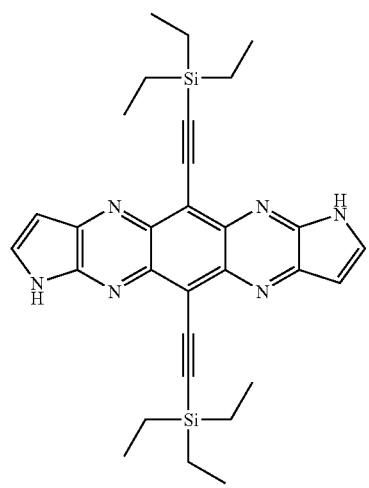
105)
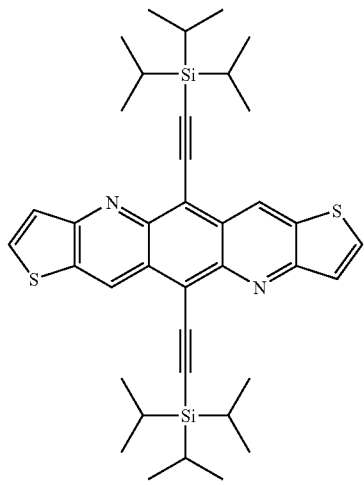
106)
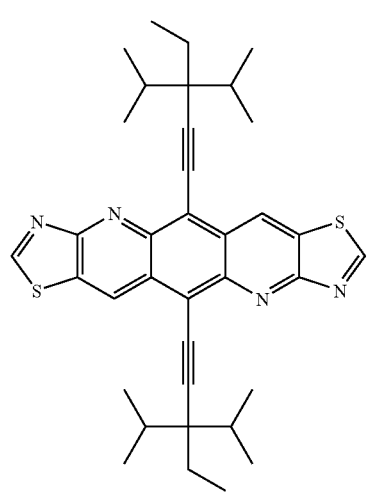
107)
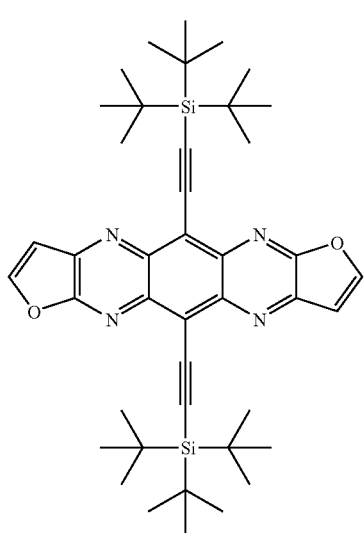
108)
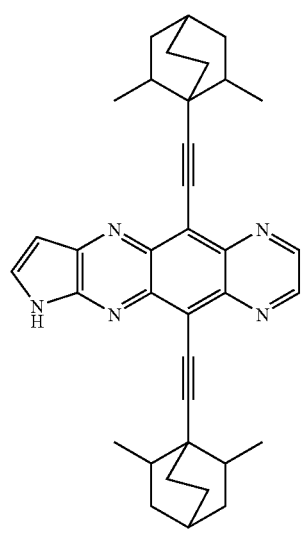
109)
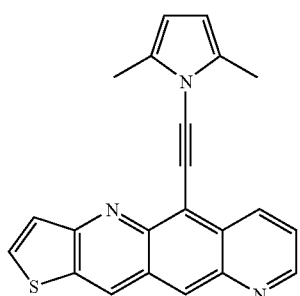

-continued
110)
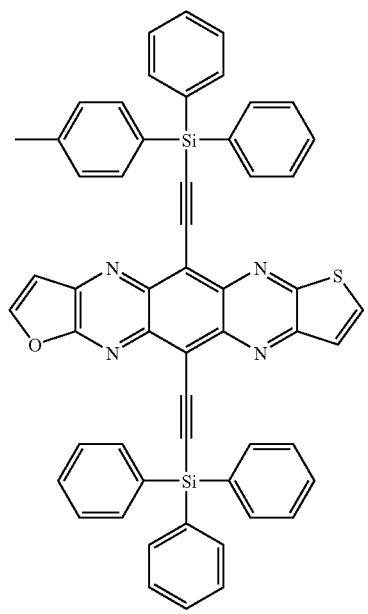
111)
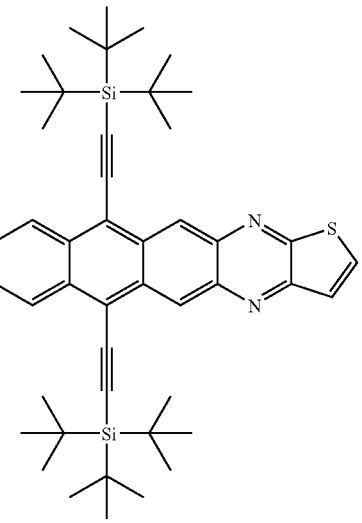
112)
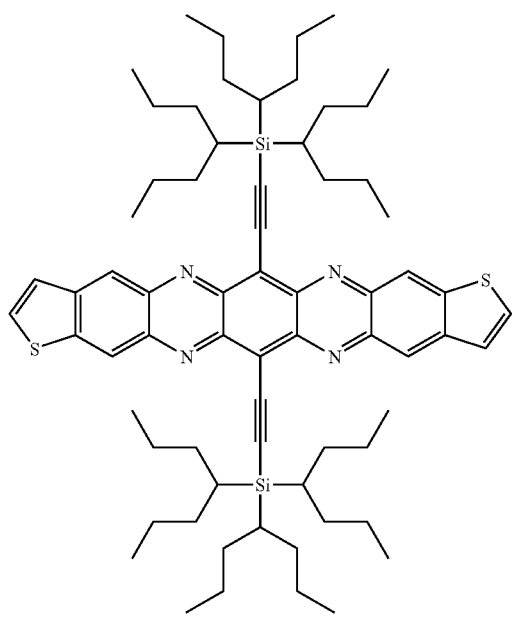
113)
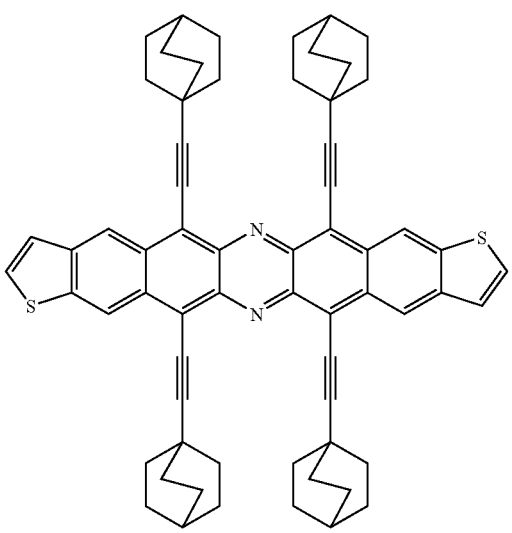
114)
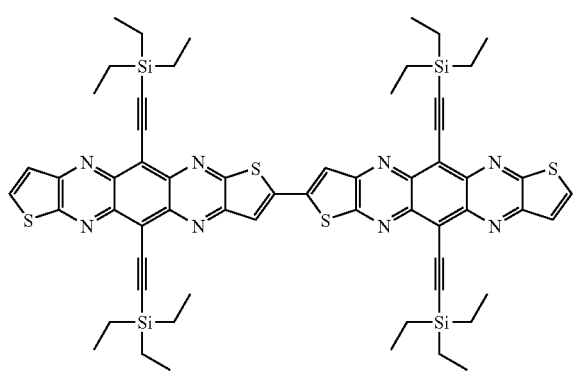
115)
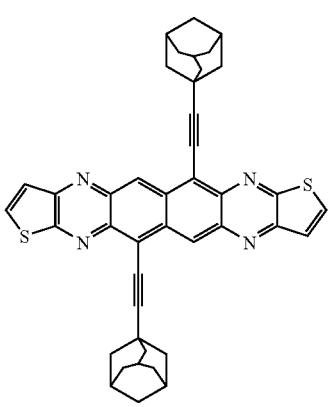

-continued
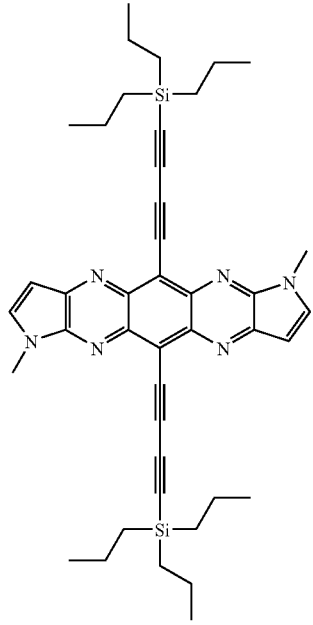
116)
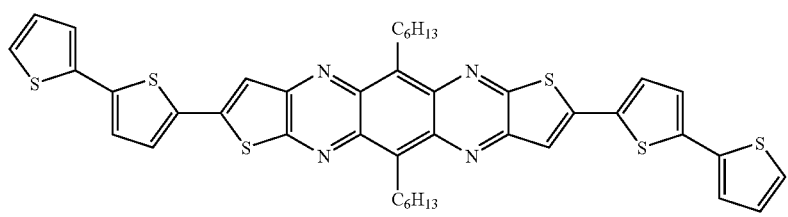
117)
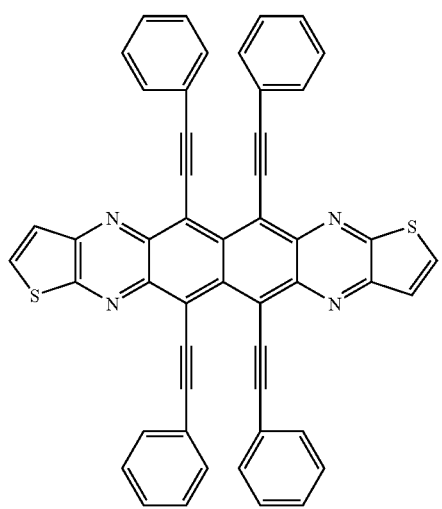
118)
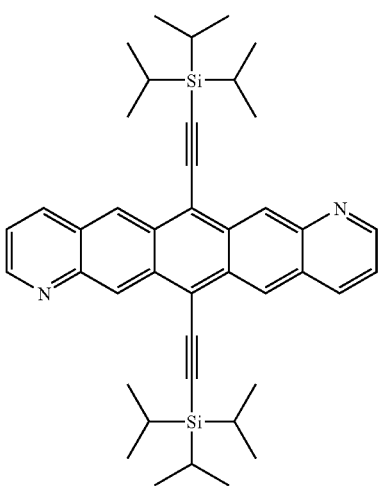
119)

-continued
120)
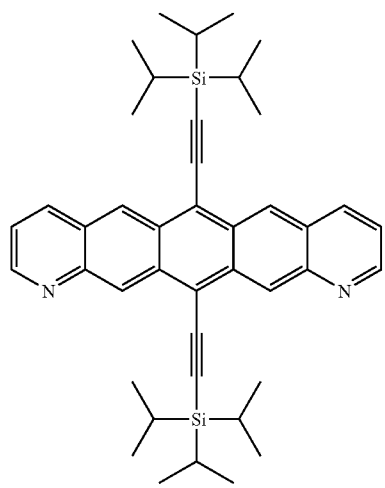
121)
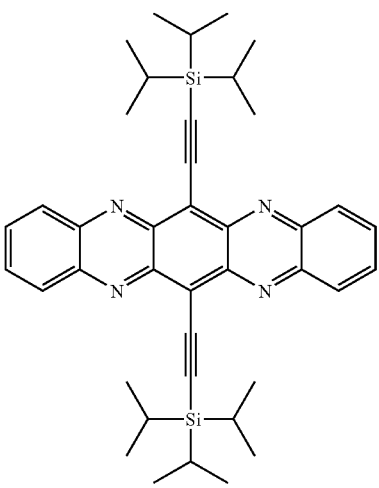
122)
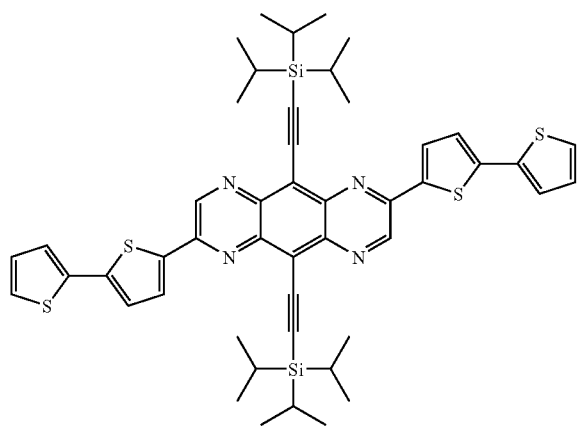
123)
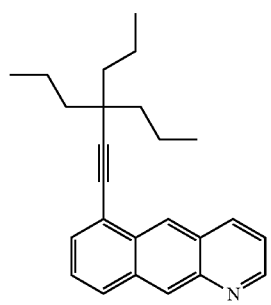
124)
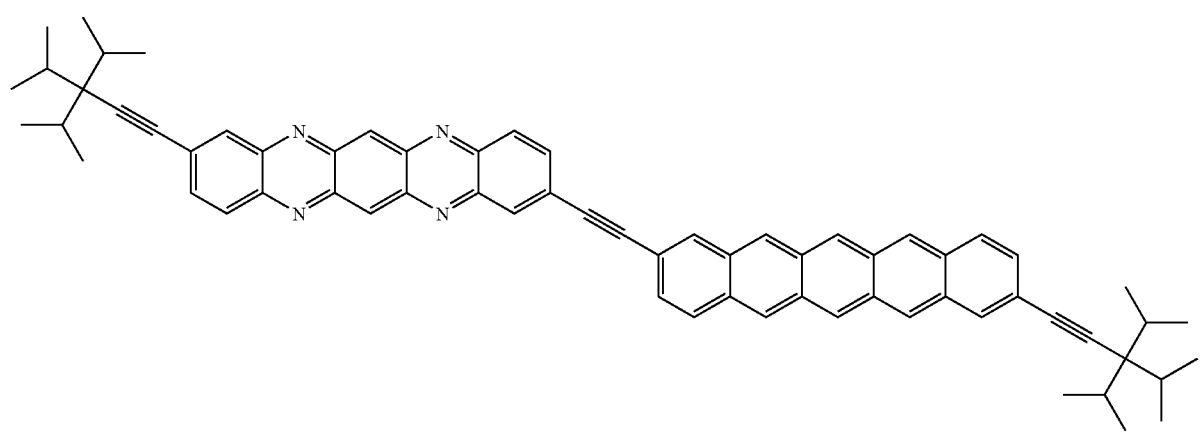
125)
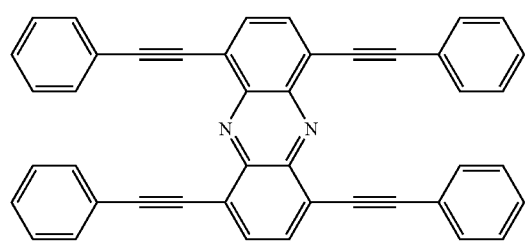

-continued
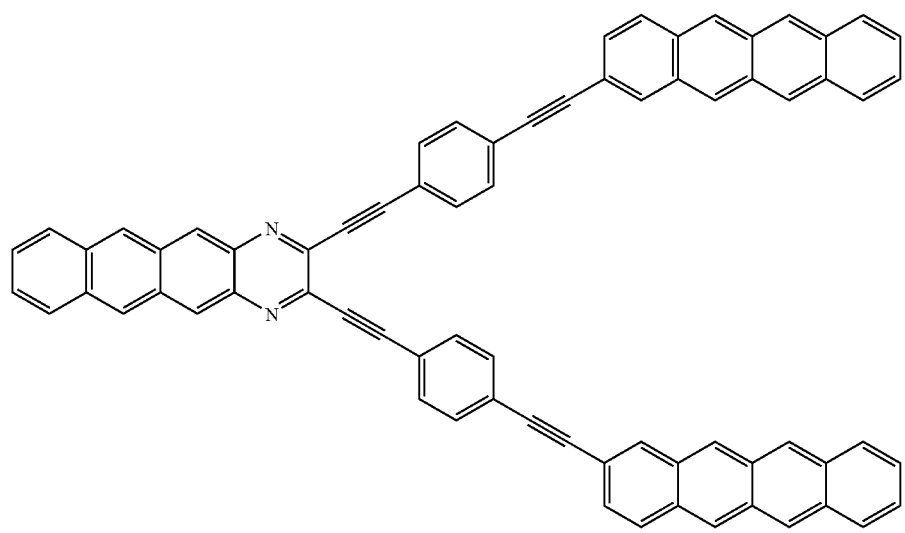
126)
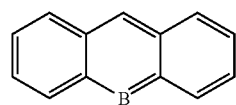
127)
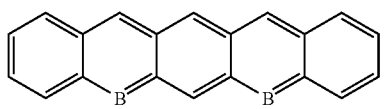
128)
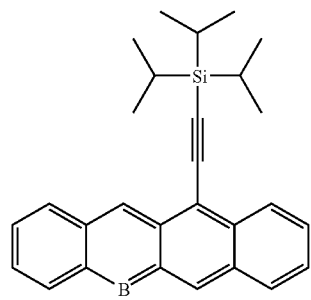
129)
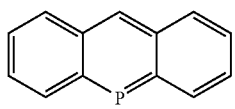
130)
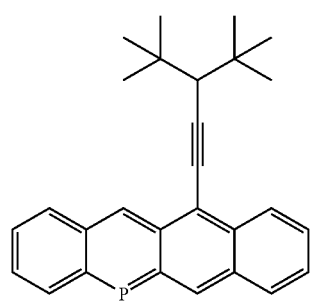
131)
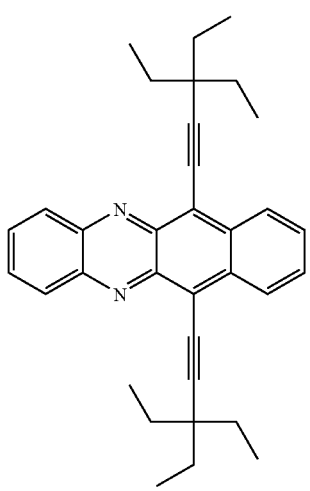
132)

A synthesis example of compound 56 is shown below as an example of synthesis of the compound represented by foregoing Formula (1) in the present invention, but the present invention is not limited thereto.

SYNTHESIS EXAMPLE 1

Synthesis of Compound 56

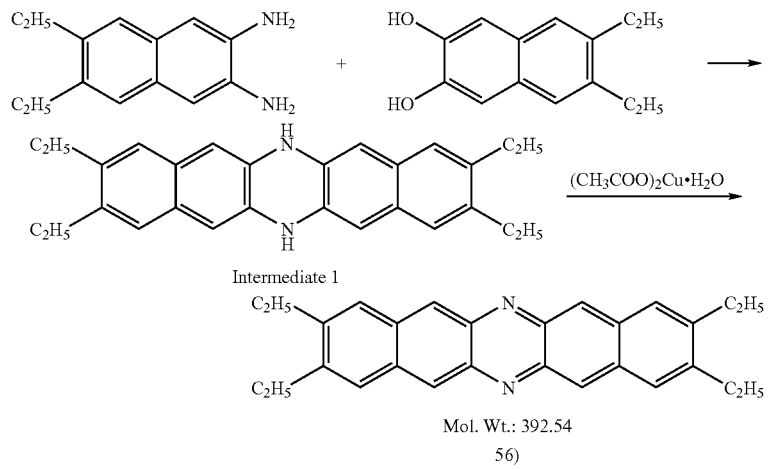

Synthesis of compound 56)

Intermediate 1

Mol. Wt.: 392.54
56)

Synthesis of Intermediate 1

Under N₂ atmosphere, 10 g (0.047 mol) of 6,7-diethyl-naphthalene-2,3-diamine and 10 g (0.047 mol) of 6,7-diethyl-naphthalene-2,3-diol were mixed and stirred at 180° C. for 1 hour. The resulting mixture was washed, and further purified via column chromatograpy to obtain 14.4 g of intermediate 1 (an yield of 78%).

Synthesis of Compound 56

Into 150 ml of a pyridine solution, in which 5 g of copper acetate.dihydrate was added, 50 ml of a pyridine solution, in which 5 g of intermediate 1 was added, was added and stirred at 100° C. for 2 hours. After the resulting reaction mixture was set back to room temperature, methanol was added to obtain a precipitate via filtration. The resulting was washed with water and methanol, and subsequently dried to obtain 3.7 g of compound 56 via column chromatography (an yield of 73%).

<<Organic TFT, Field-Effect Transistor and Switching Element>>

An organic TFT, a field-effect transistor and a switching element employing those transistors in the present invention will be described. The switching element may be called a organic TFT element, depending on a type of usage, and also called a field-effect transistor element.

A suitably functioning switching element (referred to also as a transistor device) can be provided by utilizing an organic TFT material of the present invention for a channel layer of an organic TFT or a field-effect transistor. As the organic TFT (organic thin film transistor), there are a top gate type organic thin film transistor which possesses a source electrode and a drain electrode connected with an organic semiconductor channel provided on a substrate as a channel, a gate insulating layer provided thereon, and a gate electrode provided on the gate insulating layer, and a bottom gate type organic thin film transistor which possesses a gate electrode directly on a substrate, a gate insulating layer provided on the substrate, and a source electrode and a drain electrode connected with an organic semiconductor channel on the gate insulating layer.

In order to place an organic thin film transistor material containing a compound represented by foregoing Formula (1), (2), (3) or (4) in the present invention in a channel of a switching element with an organic TFT or a field-effect transistor, it is preferred to place a solution prepared by dissolving in a suitable solvent and adding an additive if desired, provided on a substrate employing a method such as a cast coating method, a spin coating method, a printing method, an ink-jetting method or an ablation method, though a process can be conducted via vacuum evaporation.

In such the case, a solvent for dissolving the organic thin film transistor material of the present invention is not specifically limited as long as the solvent can dissolve the organic thin film transistor material to obtain a solution having an appropriate concentration. Specific examples of the solvent include a chain-formed ether solvent such as diethyl ether or di-iso-propyl ether; a cyclic ether solvent such as tetrahydrofuran or dioxane; a ketone solvent such as acetone or methyl ethyl ketone; a halogenated alkyl based solvent such as chloroform or 1,2-dichloroethane; an aromatic solvent such as toluene, o-dichlorobenzene, nitrobenzene or m-cresol; an aliphatic hydrocarbon based solvent such as N-methylpyrrolidone, carbon disulfide, hexane or octane; a cyclic hydrocarbon based solvent such as cyclohexane or such; and an aromatic hydrocarbon based solvent such as toluene or such.

In the present invention, materials for forming a source electrode, a drain electrode and a gate electrode are not specifically limited, as long as they are electrically conductive. Examples thereof include platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Platinum, gold, silver, copper, aluminum, indium, indium oxide-tin (ITO) and carbon are preferred. Further, known electrically conductive polymers whose electrical conductivity is improved by doping are preferably used. Examples thereof include electrically conductive polyaniline, electrically conductive polypyrrole, electrically conductive polythiophene, and complex of electrically conductive polyethylenedioxythiophene and polystyrene sulfonic acid. Of these, ones, which provide a low electric resistance at an interface with the semiconductor layer, are preferred.

As a method for forming the electrode, there are a method in which the electrode is formed according to a commonly known photolithography or lift-off method from an electrically conductive layer of the conductive material described above formed according to a vacuum deposition method or a sputtering method, a method in which the electrode is formed according to thermal transfer of the conductive material to a foil of a metal such as aluminum or copper, and a method in which the electrode is formed by etching a resist of the conductive material formed by an ink jet method. The electrode may be formed by ejecting in the form of electrode a solution or dispersion liquid of an electrically conductive polymer or a dispersion liquid of electrically conductive particles onto the surface on which the electrode is to be directly formed by the ink jet method or by subjecting to photolithography or laser ablation via the coated layer of the solution or the dispersion liquid. Further, employing ink or conductive paste containing an electrically conductive polymer or electrically conductive particles, the electrode may be formed by printing in the electrode pattern onto the surface on which the electrode is to be formed according to a printing method such as letterpress printing, intaglio printing, planographic printing or screen printing.

Various insulating films may be employed as the gate insulating layer. The insulating layer is preferably an inorganic oxide film composed of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above film include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, a bar coating method, or a die coating method, and a patterning method such as a printing method or an ink-jet method. These methods can be used, depending on kinds of materials used in the insulating layer.

As the typical wet process, there can be used a method of coating a dispersion liquid obtained by dispersing inorganic oxide particles in an organic solvent or water optionally in the presence of a dispersant such as a surfactant, and subsequently drying, or a so-called sol gel method of coating a solution of an oxide precursor such as an alkoxide, and subsequently drying. Among the above, an atmospheric pressure plasma method and a sol gel method are preferable.

The method of forming an insulating film by atmospheric pressure plasma treatment is a process for forming a thin film on a substrate via generation of discharge at atmospheric pressure or at approximately atmospheric pressure and by plasma-exciting a reactive gas, and its method (hereinafter referred to also as an atmospheric pressure plasma method) is described in Japanese Patent O.P.I. Publication Nos. 11-61406, 11-133205, 2000-121804, 2000-147209, and 2000-185362. This method can form a thin film having high performance at high productivity.

Further, examples of the organic compound used in the organic compound film include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan. As a method of forming the organic compound film, the wet process described above is preferably used. The inorganic oxide film and the organic oxide film can be used in combination and laminated. The thickness of the insulating film above is generally from 50 nm to 3 µm, and preferably from 100 nm to 1 µm.

The substrate is formed from a glass sheet or a flexible resin sheet. A plastic film can be employed as a sheet, for example. Examples of the plastic film include films made of polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of such a plastic film makes it possible to reduce weight, to enhance portability, and to enhance durability against impact due to its flexibility, as compared to glass.

A field-effect transistor utilizing an organic thin film formed with an organic TFT material of the present invention is described below.

FIG. 1(a)-FIG. 1(f) show examples of the constitution of an organic TFT of the present invention. FIG. 1(a) shows a field-effect transistor in which source electrode 2 and drain electrode 3 are formed on support 6 and organic semiconductor layer 1 of the organic thin film transistor material according to the present invention is provided between electrodes, and insulating layer 5 is formed thereon, and gate electrode 4 is formed on insulating layer 5 to form the field-effect transistor. FIG. 1(b) shows one in which organic semiconductor layer 1 is formed by a coating method so that the layer covers the entire surface of the electrode and the substrate; such the layer is formed between two electrodes in FIG. 1(a). In FIG. 1(c), organic semiconductor layer 1 is firstly formed by coating onto substrate 6 and then source electrode 2, drain electrode 3, insulating layer 5 and gate electrode 4 are provided.

In FIG. 1(d), gate electrode 4 of metal foil is formed on support 6 that then insulating layer 5 is formed thereon, source electrode 2 and drain electrode 3 each formed by the metal foil on the insulating layer, and then semiconductor layer 1 is formed between the electrodes by the organic thin film transistor material of the present invention. Furthermore, the structures shown in FIG. 1(e) and FIG. 1 (f) can also be employed.

Figure 2:
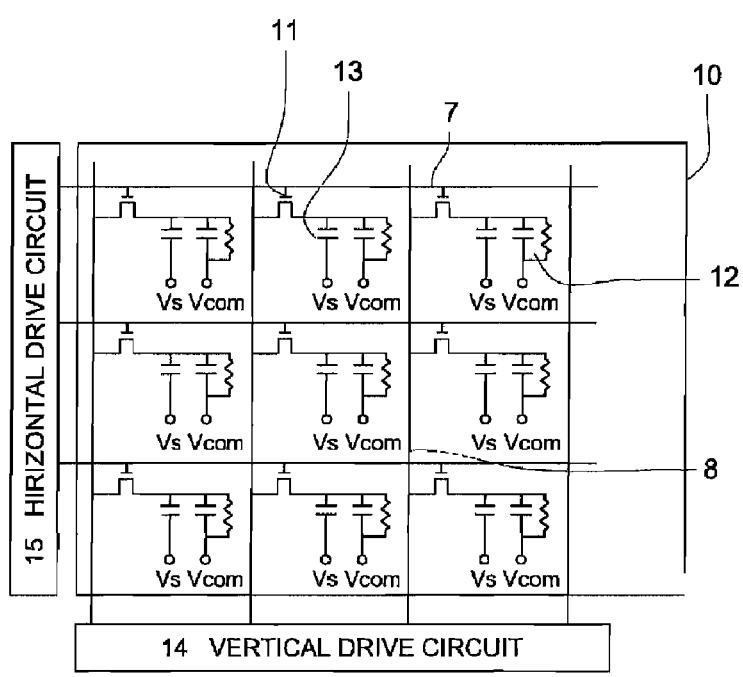
FIG. 2 shows an example of the schematic equivalent circuit drawing of an organic TFT of the present invention.

FIG. 2 shows an example of a schematic equivalent circuit diagram of an organic TFT sheet.

Organic TFT sheet 10 includes many organic TFT 11 arranged in a matrix. Numeral 7 is a gate busline of each of TFT 11, and 8 is a source busline of each of TFT 11. To the source electrode of each of TFT 11, output element 12 is connected which is, for example, a liquid crystal or an electrophoretic element constituting the pixel of the displaying apparatus. The pixel electrode may be used as an input electrode of a photosensor. In an example shown in the figure, the liquid crystal as an output element is shown by an equivalent circuit composed of a resistor and a capacitor. Numeral 13 is a storage capacitor, numeral 14 is vertical drive circuit, and numeral 15 is a horizontal drive circuit.

EXAMPLE

Next, the present invention will be described referring to examples, but embodiments of the present invention are not limited thereto.

Example 1

<<Preparation of Organic Thin Film Transistor 1>>

A gate insulating layer was prepared by forming a thermally-oxidized film having a thickness of 2000 A on a Si wafer having a specific resistance of 0.01 Ω·cm as a gate electrode to subsequently conduct a surface treatment with octadecyltrichlorosilane. Dissolved is a content of 0.5% by weight of comparative compound <1> [poly(3-hexyl thiophene)(regioregular produced by Aldrich Co. Ltd., an average molecular weight of 89000, and PHT)], based on toluene bubbled with nitrogen under $N_2$ atmosphere for 30 minutes to conduct spin coating under $N_2$ atmosphere (a number of revolutions of 2500 rpm for 15 minutes) and to form a cast film (a thickness of 50 nm) via naturally drying, and heat treatment was carried out at 50° C. under $N_2$ atmosphere for 30 minutes.

Gold was evaporated onto this film surface employing a mask to form a source electrode and a drain electrode. The source and drain electrodes have a width of 100 μm and a thickness of 200 nm to prepare organic thin film transistor 1 having a channel width W of 3 mm and a channel length L of 20 μm.

<<Preparation of Organic Thin Film Transistor 2>>

Organic thin film transistor 2 was prepared similarly to preparation of organic thin film transistor 1, except that comparative compound <1> was replaced by comparative compound <2> (pentacene, employed by purifying a commercially available reagent produced by Aldrich Co., Ltd. via sublimation).

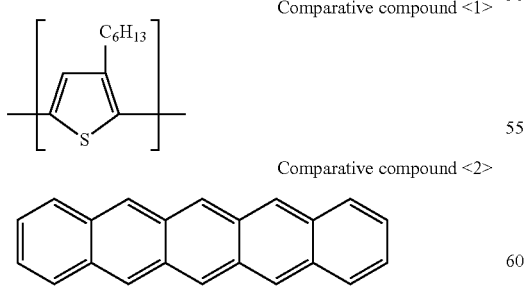

Comparative compound <1>

Comparative compound <2>

<<Preparation of Organic Thin Film Transistor 3>>

Comparative compound <3> (2,3,9,10-tetrahexylpentacene) was synthesized by a method described in Organic Letters, vol. 2, p 85 (2000).

Organic thin film transistor 3 was prepared similarly to preparation of organic thin film transistor 1, except that comparative compound <1> was replaced by comparative compound <3>.

<<Preparation of Organic Thin Film Transistor 4>>

Organic thin film transistors 4 was prepared similarly to preparation of organic thin film transistor 1, except that comparative compound <1> was replaced by comparative compound <4> (rubrene, employed by purifying a commercially available reagent produced by Aldrich Co., Ltd. via sublimation).

<<Preparation of Organic Thin Film Transistor 5>>

Comparative compound <5> was synthesized by a method described in J. Am. Chem. Soc., vol. 123, p 9486 (2001) supporting information.

Organic thin film transistor 5 was prepared similarly to preparation of organic thin film transistor 1, except that comparative compound <1> was replaced by comparative compound <5>.

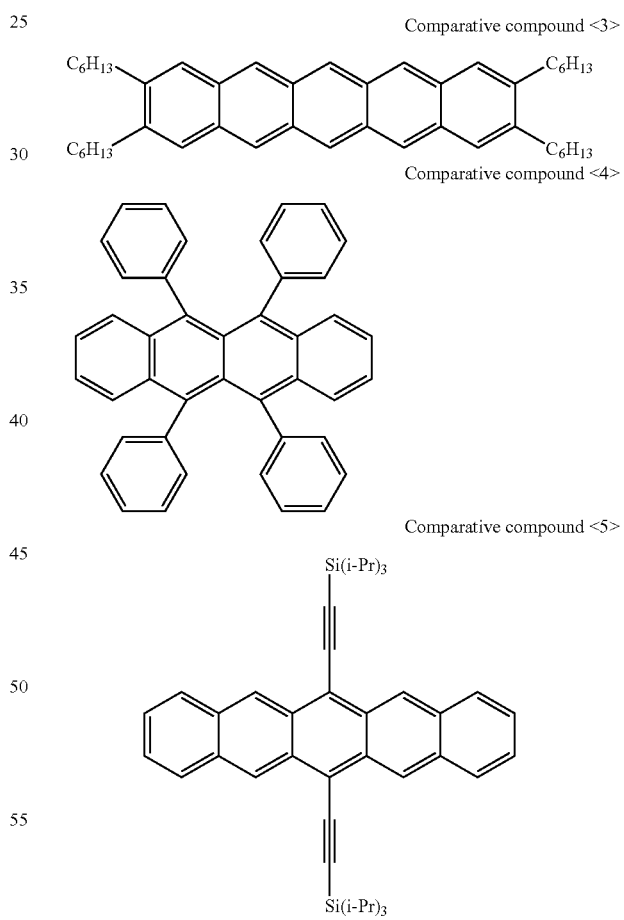

Comparative compound <3>

Comparative compound <4>

Comparative compound <5>

<<Preparation of Organic Thin Film Transistors 6-14>>

Organic thin film transistors 6-14 were prepared similarly to preparation of organic thin film transistor 1, except that comparative compound <1> was replaced by an organic semiconductor material of the present invention described in Table 1.

<<Evaluation of Carrier Mobility and ON/OFF Ratio>>

As to the resulting organic thin film Transistors 1-14, the carrier mobility and the ON/OFF ratio of each element were measured immediately after preparing the element. Incidentally, in the present invention, the carrier mobility was determined from a saturation region of I-V characteristics, and the ON/OFF ratio was further determined from a ratio of the drain currents when the drain bias was set to −50 V and the gate bias was set at −50 V and 0 V.

The same evaluation of the carrier mobility and the ON/OFF ratio as above was made again after placing each element in an environmental chamber of 40° C. and 90% RH for 48 hours.

TABLE 1

| Organic TFT | Compound | Immediately after preparation | | After storing at 40° C. and 90% RH for 48 hours | | Remarks |
|---|---|---|---|---|---|---|
| | | Mobility (cm$^2$/Vsec) | ON/OFF ratio | Mobility (cm$^2$/Vsec) | ON/OFF ratio | |
| 1 | Comparative compound <1> | $1.0 \times 10^{-2}$ | $1.2 \times 10^3$ | $5.4 \times 10^{-5}$ | $1.0 \times 10^1$ | Comp. |
| 2 | Comparative compound <2> | No film able to be formed | No film able to be formed | No film able to be formed | No film able to be formed | Comp. |
| 3 | Comparative compound <3> | $6.0 \times 10^{-2}$ | $3.0 \times 10^3$ | Not able to be measured | Not able to be measured | Comp. |
| 4 | Comparative compound <4> | $7.2 \times 10^{-5}$ | $4.0 \times 10^2$ | Not able to be measured | Not able to be measured | Comp. |
| 5 | Comparative compound <5> | $9.0 \times 10^{-1}$ | $8.4 \times 10^6$ | $3.7 \times 10^{-3}$ | $1.3 \times 10^3$ | Comp. |
| 6 | Exemplified compound 5) | $1.5 \times 10^{-1}$ | $3.9 \times 10^5$ | $8.7 \times 10^{-2}$ | $2.4 \times 10^5$ | Inv. |
| 7 | Exemplified compound 22) | $7.4 \times 10^{-2}$ | $3.8 \times 10^5$ | $4.1 \times 10^{-2}$ | $2.5 \times 10^5$ | Inv. |
| 8 | Exemplified compound 56) | $3.4 \times 10^{-1}$ | $5.0 \times 10^5$ | $1.4 \times 10^{-1}$ | $4.1 \times 10^5$ | Inv. |
| 9 | Exemplified compound 58) | $1.8 \times 10^{-1}$ | $4.5 \times 10^5$ | $8.7 \times 10^{-2}$ | $2.8 \times 10^5$ | Inv. |
| 10 | Exemplified compound 68) | $8.7 \times 10^{-2}$ | $3.9 \times 10^5$ | $5.4 \times 10^{-2}$ | $2.3 \times 10^5$ | Inv. |
| 11 | Exemplified compound 73) | $2.7 \times 10^{-1}$ | $4.3 \times 10^5$ | $1.1 \times 10^{-1}$ | $2.8 \times 10^5$ | Inv. |
| 12 | Exemplified compound 82) | $7.5 \times 10^{-1}$ | $8.2 \times 10^6$ | $3.4 \times 10^{-1}$ | $5.3 \times 10^6$ | Inv. |
| 13 | Exemplified compound 86) | $5.9 \times 10^{-1}$ | $5.3 \times 10^6$ | $2.1 \times 10^{-1}$ | $3.0 \times 10^6$ | Inv. |
| 14 | Exemplified compound 132) | $4.2 \times 10^{-1}$ | $1.8 \times 10^6$ | $1.6 \times 10^{-1}$ | $8.7 \times 10^5$ | Inv. |

Comp.: Comparative example;
Inv.: Present invention

It is to be understood that organic thin film transistors 6-14 prepared with the organic semiconductor material of the present invention exhibit excellent properties of the carrier mobility as well as the ON/OFF ratio immediately after the preparation, and have a carrier mobility of at least $10^{-2}$ and an ON/OFF ratio of at least $10^5$ even after the durability test is carried out, resulting in reduced aging degradation together with high durability.

What is claimed is:

1. An organic thin film transistor material comprising a polycondensed heteroaromatic compound represented by the following Formula (1):

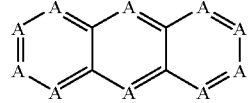

Formula (1)

where each A independently represents a nonmetal atom, provided that at least one of plural As is an atom other than a carbon atom, or at least two of nonmetal atoms represented by A are carbon atoms and when each of the carbon atoms comprises a substituent, substituents may be bonded with each other to form a ring.

2. The organic thin film transistor material of claim 1, wherein the polycondensed heteroaromatic compound of Formula (1) is a compound represented by the following Formula (2), (3) or (4):

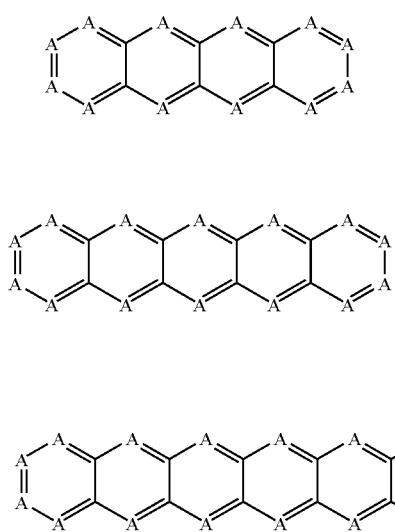

Formula (2)

Formula (3)

Formula (4)

where each A in Formulae (2), (3) and (4) independently represents a nonmetal atom, provided that at least one of plural As is an atom other than a carbon atom.

3. The organic thin film transistor material of claim 1, wherein A is N, P or C—R, where R is a hydrogen atom, a halogen atom or a substituent, and R may be bonded with other Rs with each other to form a ring.

4. The organic thin film transistor material of claims 1, wherein A is N or C—R, where R is a hydrogen atom, a halogen atom or a substituent, and R may be bonded with other Rs with each other to form a ring.

5. The organic thin film transistor material of claims 1, wherein at least one of (C—R)s represented by A is C—C≡C—R$_1$, where R$_1$ represents a substituent.

6. The organic thin film transistor material of claim 1, wherein the polycondensed heteroaromatic compound represented by Formula (1) is a compound represented by the following Formula (5):

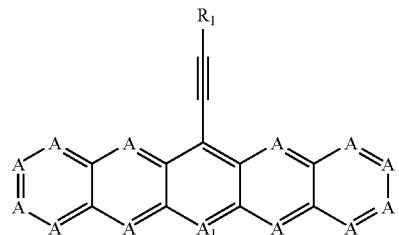

Formula (5)

where A in Formula (5) is synonymous with A in Formula (1), and R$_1$ represents a substituent.

7. The organic thin film transistor material of claim 6, wherein A and A$_1$ are N or C—R, where R is a hydrogen atom, a halogen atom or a substituent, and R may be bonded with other Rs with each other to form a ring.

8. The organic thin film transistor material of claim 6, wherein A$_1$ is C—C≡C—R$_1$, where R$_1$ is synonymous with A in Formula (5).

9. An organic thin film transistor comprising a semiconductor layer formed from the organic thin film transistor material of claims 1.

10. A field-effect transistor comprising an organic charge transport material and a gate electrode connected directly or indirectly to the organic charge transport material, wherein an electric current in the organic charge transport material is controlled via application of an electric potential between the gate electrode and the organic charge transport material, and wherein the organic charge transport material is the organic thin film transistor material of claim 1.

11. A switching element comprising the organic thin film transistor of claim 9.

12. An organic semiconductor material comprising a compound represented by any one of Formulae (1)-(5).

13. An organic semiconductor film comprising the organic semiconductor material of claim 12.

14. An organic semiconductor film formed via the steps of:
(a) dissolving or dispersing the organic semiconductor material of claim 12 in an organic solvent; and
(b) conducting a drying process after coating a solution or dispersant obtained in step (a).

15. A switching element comprising the field-effect transistor of claim 10.

* * * * *